US012645606B2

(12) United States Patent
Gold et al.

(10) Patent No.: US 12,645,606 B2
(45) Date of Patent: *Jun. 2, 2026

(54) STORAGE DEVICE WITH ENCODED DATA LOOKUP

(71) Applicant: PURE STORAGE, INC., Santa Clara, CA (US)

(72) Inventors: Brian T. Gold, Los Altos, CA (US); John Hayes, Mountain View, CA (US); Hari Kannan, Sunnyvale, CA (US)

(73) Assignee: EVERPURE INC., Santa Clara, CA (US)

( * ) Notice: Subject to any disclaimer, the term of this patent is extended or adjusted under 35 U.S.C. 154(b) by 83 days.

This patent is subject to a terminal disclaimer.

(21) Appl. No.: 18/603,960

(22) Filed: Mar. 13, 2024

(65) Prior Publication Data

US 2024/0220419 A1 Jul. 4, 2024

Related U.S. Application Data

(63) Continuation of application No. 16/953,079, filed on Nov. 19, 2020, now Pat. No. 11,971,828, which is a continuation of application No. 14/871,757, filed on Sep. 30, 2015, now Pat. No. 10,853,266.

(51) Int. Cl.
| | |
|---|---|
| *G06F 12/109* | (2016.01) |
| *G06F 11/10* | (2006.01) |
| *G06F 11/14* | (2026.01) |
| *G06F 11/1446* | (2026.01) |
| *G06F 12/02* | (2006.01) |
| *G11C 29/00* | (2006.01) |
| *G11C 29/04* | (2006.01) |

(52) U.S. Cl.
CPC ........ *G06F 12/109* (2013.01); *G06F 11/1072* (2013.01); *G06F 11/1076* (2013.01); *G06F 11/1435* (2013.01); *G06F 11/1456* (2013.01); *G06F 12/0246* (2013.01); *G11C 29/789* (2013.01); *G11C 29/86* (2013.01); *G06F 2201/84* (2013.01); *G06F 2212/657* (2013.01); *G06F 2212/7201* (2013.01); *G11C 2029/0411* (2013.01)

(58) Field of Classification Search
CPC ........................ G06F 11/1435; G06F 12/0246
See application file for complete search history.

(56) References Cited

U.S. PATENT DOCUMENTS

| | | | |
|---|---|---|---|
| 7,975,115 | B2 | 7/2011 | Wayda et al. |
| 8,504,797 | B2 | 8/2013 | Mimatsu |
| 8,822,155 | B2 | 9/2014 | Sukumar et al. |

(Continued)

FOREIGN PATENT DOCUMENTS

EP 2610748 A1 7/2013

OTHER PUBLICATIONS

International Search Report and Written Opinion for International Application No. PCT/US2016/054110, mailed Dec. 30, 2016, 12 Pages.

*Primary Examiner* — Gary W. Cygiel

(57) ABSTRACT

A method for hardware assisted data lookup in a storage unit is provided. The method includes formatting data in at least one of a plurality of data formats for storage in the storage unit. The method includes configuring a logic unit with one or more parameters associated with the plurality of data formats and identifying incoming data with the one or more parameters as an instruction for execution.

20 Claims, 7 Drawing Sheets

(56)  References Cited

U.S. PATENT DOCUMENTS

| 9,280,678 B2 | 3/2016 | Redberg |
| 9,395,922 B2 | 7/2016 | Nishikido et al. |
| 10,324,639 B2 | 6/2019 | Seo |
| 10,567,406 B2 | 2/2020 | Astigarraga et al. |
| 10,846,137 B2 | 11/2020 | Vallala et al. |
| 10,877,683 B2 | 12/2020 | Wu et al. |
| 11,076,509 B2 | 7/2021 | Alissa et al. |
| 11,106,810 B2 | 8/2021 | Natanzon et al. |
| 11,194,707 B2 | 12/2021 | Stalzer |
| 2008/0256141 A1 | 10/2008 | Wayda et al. |
| 2010/0306500 A1 | 12/2010 | Mimatsu |
| 2013/0326117 A1 | 12/2013 | Aune |
| 2014/0220561 A1 | 8/2014 | Sukumar et al. |
| 2015/0154418 A1 | 6/2015 | Redberg |
| 2015/0193168 A1 | 7/2015 | Sundaram et al. |
| 2016/0026397 A1 | 1/2016 | Nishikido et al. |
| 2016/0182542 A1 | 6/2016 | Staniford |
| 2016/0248631 A1 | 8/2016 | Duchesneau |
| 2017/0262202 A1 | 9/2017 | Seo |
| 2018/0054454 A1 | 2/2018 | Astigarraga et al. |
| 2019/0220315 A1 | 7/2019 | Vallala et al. |
| 2020/0034560 A1 | 1/2020 | Natanzon et al. |
| 2020/0326871 A1 | 10/2020 | Wu et al. |
| 2021/0360833 A1 | 11/2021 | Alissa et al. |

STORAGE DEVICE WITH ENCODED DATA LOOKUP

CROSS REFERENCE TO RELATED APPLICATIONS

This application is a continuation application for patent entitled to a filing date and claiming the benefit of earlier-filed U.S. patent application Ser. No. 16/953,079, filed Nov. 19, 2020, which is a continuation application of U.S. patent application Ser. No. 14/871,757, filed Sep. 30, 2015, issued Dec. 1, 2020 as U.S. Pat. No. 10,853,266, all of which are hereby incorporated herein by reference in their entirety.

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

SUMMARY

In some embodiments, a method for hardware assisted data lookup in a storage unit is provided. The method includes formatting data in at least one of a plurality of data formats for storage in the storage unit. The method includes configuring a logic unit with one or more parameters associated with the plurality of data formats and identifying incoming data with the one or more parameters as an instruction for execution.

In some embodiments, a storage cluster is provided. The storage cluster includes a plurality of storage nodes, coupled together as the storage cluster and a plurality of storage units, each having storage memory. At least one of the plurality of storage units has a data layout engine and a logic module, the data layout engine is operable to configure the logic module with one or more parameters associated with a plurality of data formats and wherein the logic module identifies incoming data, with the one or more parameters, as an instruction for execution.

In some embodiments, a storage unit that communicates with a plurality of storage nodes of a storage cluster is provided. The storage unit includes a logic module having a state machine and one or more registers or counters. The logic unit includes a data layout engine configured to write one or more parameters to the one or more registers or counters of the logic module to enable the logic module to parse data associated with at least one data format of a plurality of data formats. The logic module is configured to identify incoming data, with the one or more parameters, as an instruction for execution.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
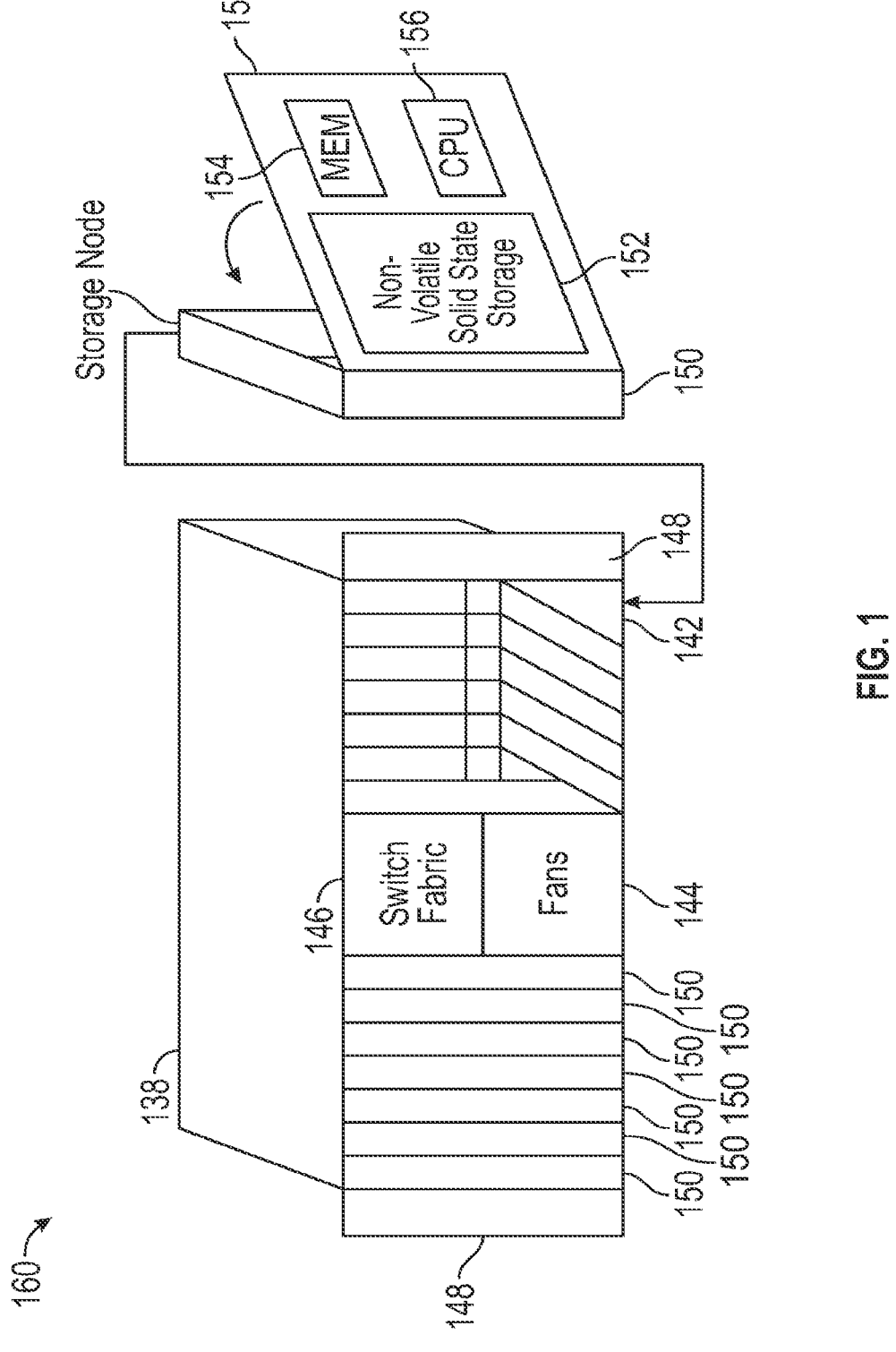
FIG. 1 is a perspective view of a storage cluster with multiple storage nodes and internal storage coupled to each storage node to provide network attached storage, in accordance with some embodiments.

A storage cluster with storage nodes and storage units with storage memory is herein described. One or more of the storage units, and in some embodiments, each of the storage units, has a data layout engine and a logic module that can find an instruction encoded explicitly or implicitly into metadata in a page in storage memory. The storage unit performs an action based on the instruction, such as returning data from the same page or another page of the storage memory, reading another page and determining an action, or searching in the same page or another page. A storage node can pass a parameter to the storage unit, by encoding the instruction into the metadata in the page of storage memory. The data layout engine can pass a parameter to the logic module by writing to a register or counter of the logic module, and thereby communicate information about formatting of storage memory and explicit or implicit instructions. The logic module monitors data flow from storage memory to buffer memory, and, based on this and the information communicated by the data layout engine, determines an instruction and corresponding action. The storage cluster, storage nodes and storage units are described below with reference to FIGS. 1-3. Embodiments of the data layout engine and the logic module are described below with reference to FIGS. 4-9.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 1, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2:
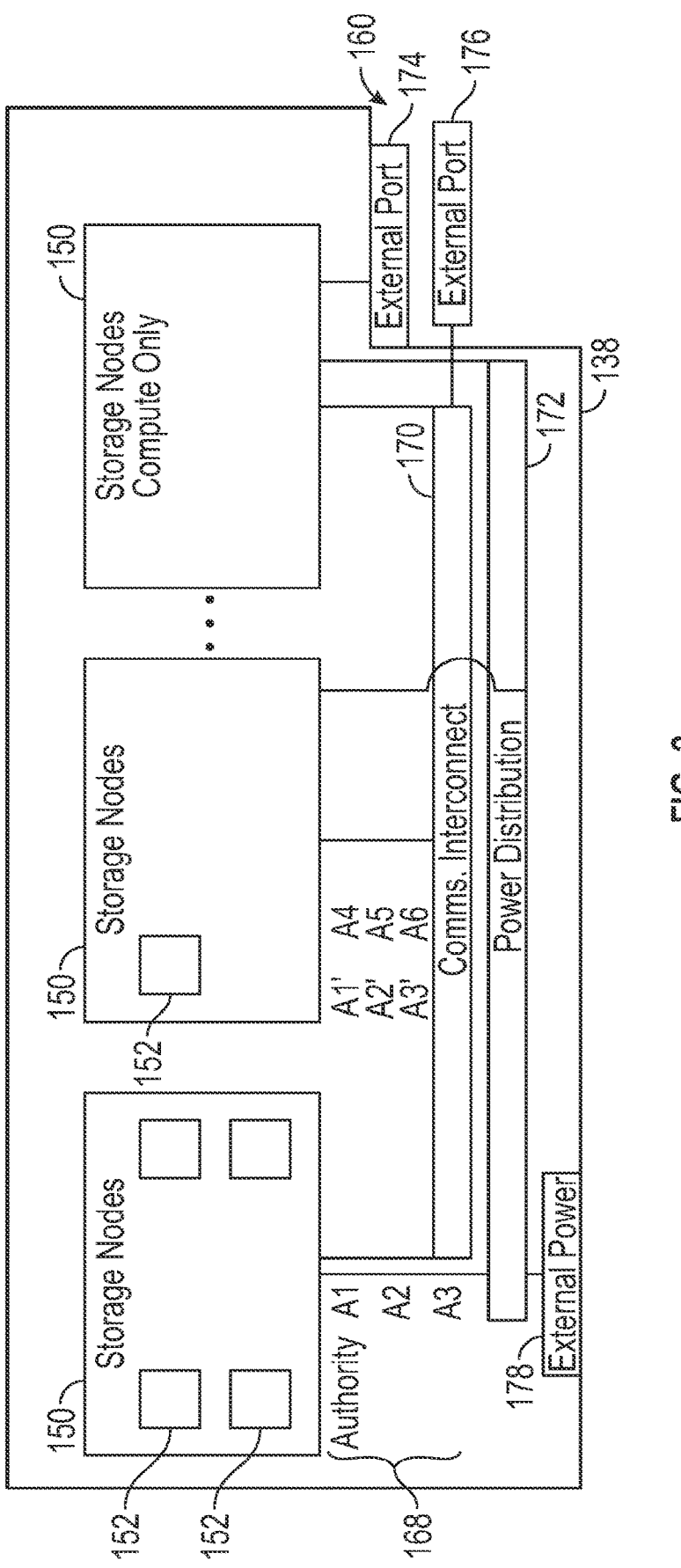
FIG. 2 is a block diagram showing an interconnect switch coupling multiple storage nodes in accordance with some embodiments.

FIG. 2 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 2, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 1. In addition, one or more storage nodes 150 may be a compute only storage node as illustrated in FIG. 2. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatedly and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1 and 2, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

Figure 3:
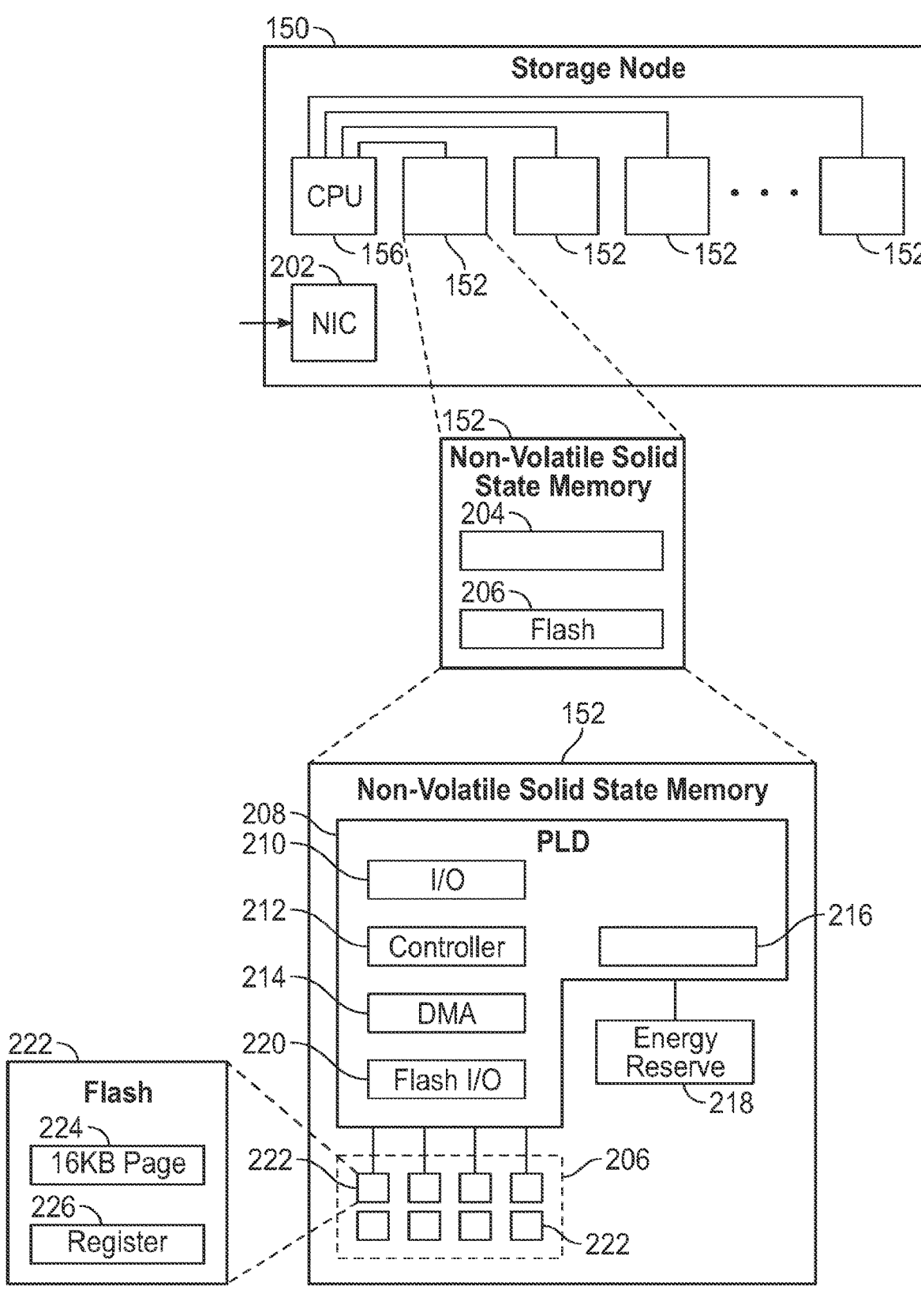
FIG. 3 is a multiple level block diagram, showing contents of a storage node and contents of one of the non-volatile solid state storage units in accordance with some embodiments.

FIG. 3 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 3, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 160, in various embodiments as disclosed herein, can be contrasted with storage arrays in general. The storage nodes 150 are part of a collection that creates the storage cluster 160. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 160, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 4:
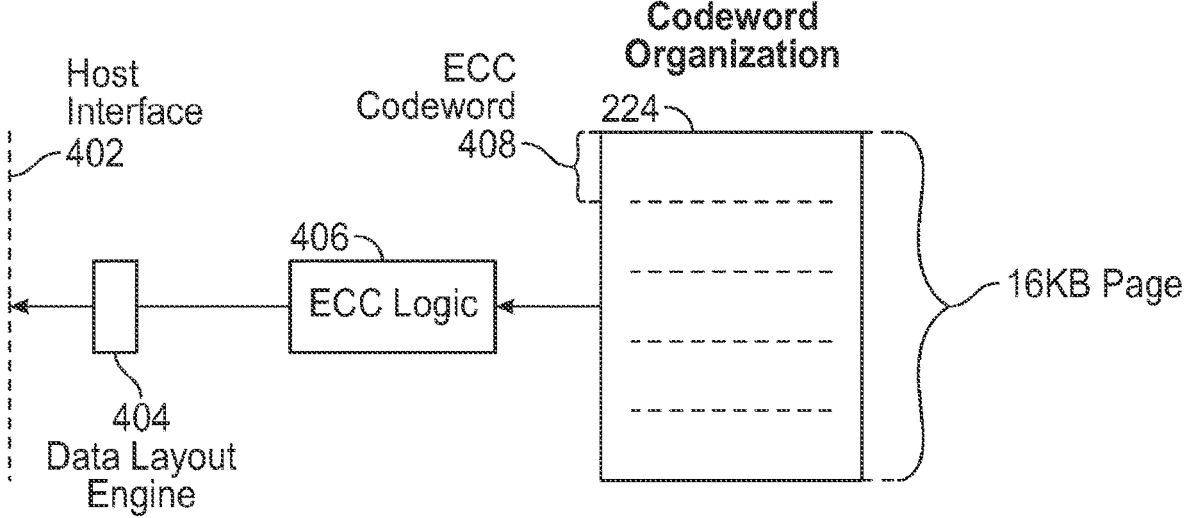
FIG. 4 depicts a host interface, a data layout engine and error correcting code logic of a storage unit, interacting with a page of storage memory in accordance with some embodiments.

FIG. 4 depicts a host interface 402, a data layout engine 404 and error correcting code logic 406 of a storage unit 152, interacting with a page 224 of storage memory. Aspects of organization of pages 224 are discussed below with reference to FIGS. 4-6, and this is followed by an embodiment of the data layout engine 404 in FIG. 7. The data layout engine 404 is a component in a storage unit 152 (see FIGS. 1-3), and can be implemented using software, firmware, hardware or combinations thereof. The host interface 402 couples the storage unit 152 to one or more storage nodes 150 in a storage cluster 160. For example, the host interface 402 could include a bus coupling or a network coupling. In the embodiment shown, the data layout engine 404 sits in a path between error correcting code logic 406 and the host interface 402. Each page 224 of storage memory is organized into multiple error correcting code codewords 408. Error correcting code logic 406 acts on an error correcting code codeword 408, performing error correction to the codeword 408 in a conventional manner. The data layout engine 404 receives a corrected codeword 408, and determines where to find an instruction, and optionally a parameter, as will be further described below. The instruction 604 directs the storage unit 152 to perform an action.

Figure 5:
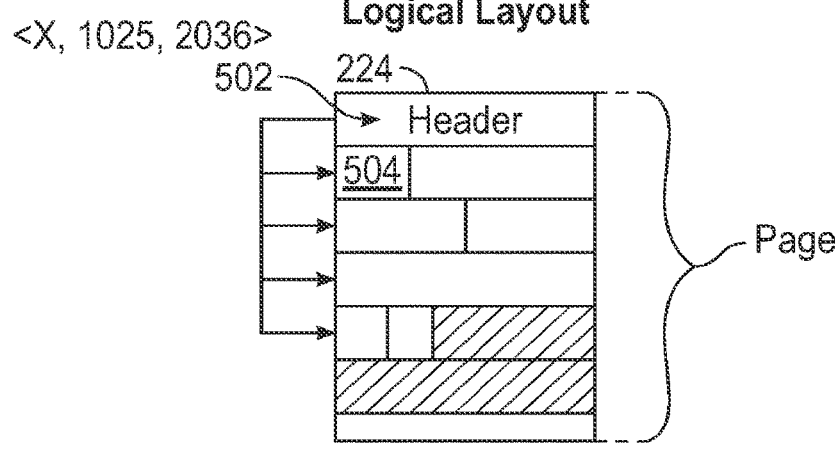
FIG. 5 is an example logical layout of a page of storage memory, with a header and logical records in accordance with some embodiments.

FIG. 5 is an example logical layout of a page 224 of storage memory, with a header 502 and logical records 504. The header 502 contains information pointing to logical records 504, such as an identifier of a logical record, shown in the example as the letter "x", and starting and ending addresses (e.g., 1025, 2036 as shown in the example) of the logical record 504. The shaded area in the page 224 represents erased blocks which do not yet contain logical records 504. Generally, to read client datum "x" (e.g., a piece of data, one or more bits), the storage unit reads the page header 502, determines the location of the client datum, and reads the client datum from the determined location.

Figure 6:
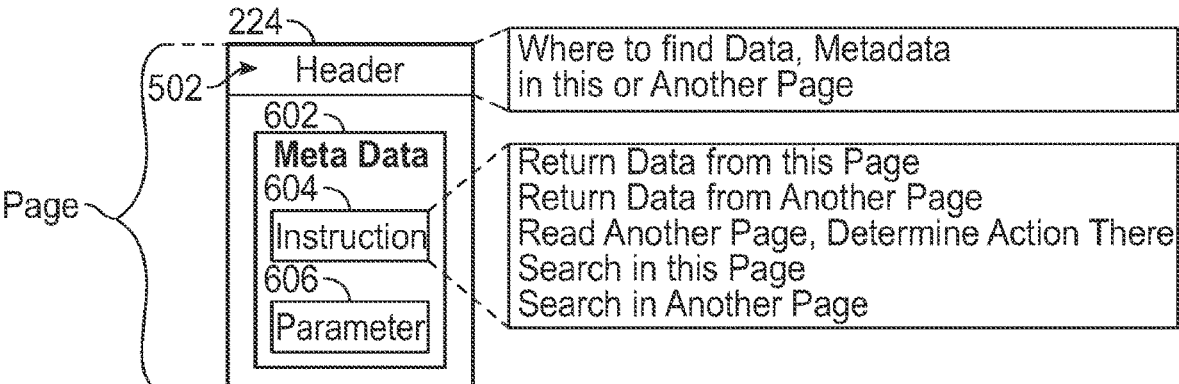
FIG. 6 is an example of a page of storage memory, with a header, and metadata that has an instruction and a parameter encoded in the metadata in accordance with some embodiments.

FIG. 6 is an example of a page 224 of storage memory, with a header 502, and metadata 602 that has an instruction 604 and a parameter 606 encoded in the metadata 602. In some embodiments, in order for the data layout engine 404 to find the instruction 604, the data layout engine 404 reads the header 502. The header 502 has information about where to find data or metadata in this or another page 224. In further embodiments, information about where to find data or metadata could be elsewhere on the page 224, and the data layout engine 404 would be designed accordingly. Once the data layout engine 404 obtains the location information from the header 502 (or elsewhere on the page 224), the data layout engine 404 reads the metadata 602 according to that location information. Next, the data layout engine 404 finds the instruction 604 in the metadata 602. In some embodiments, an instruction 604 can be accompanied by a parameter 606. The data layout engine 404 determines whether the instruction 604 is accompanied by a parameter, in such embodiments, and obtains the parameter 606 from the metadata 602 where appropriate.

As examples of instructions 604 and associated actions, the instruction 604 could direct the storage unit 152 to return data from the page 224, or return data from another page 224. If the data is to be returned from another page, the parameter 606 could direct where to find that other page 224 and that data, e.g., by providing an address and/or other location information. The instruction 604 could direct to read another page 224 and determine an action, e.g., by finding another instruction 604 on that page 224. The instruction 604 could direct to search on the page 224, e.g., according to the parameter 606. The instruction 604 could direct to search on another page 224. This process can be nested, in some embodiments, so that an instruction 604 on one page 224 can lead to an instruction 604 on another page 224, which could lead to yet another instruction 604 on yet another page 224, and so on. Searches so directed could be confined to one page 224, or could cross page boundaries. Data returns so directed could be confined to one page 224, or could cross page boundaries. Results of the actions are returned via the host interface 402 (see FIG. 4) to a storage node 150.

Figure 7:
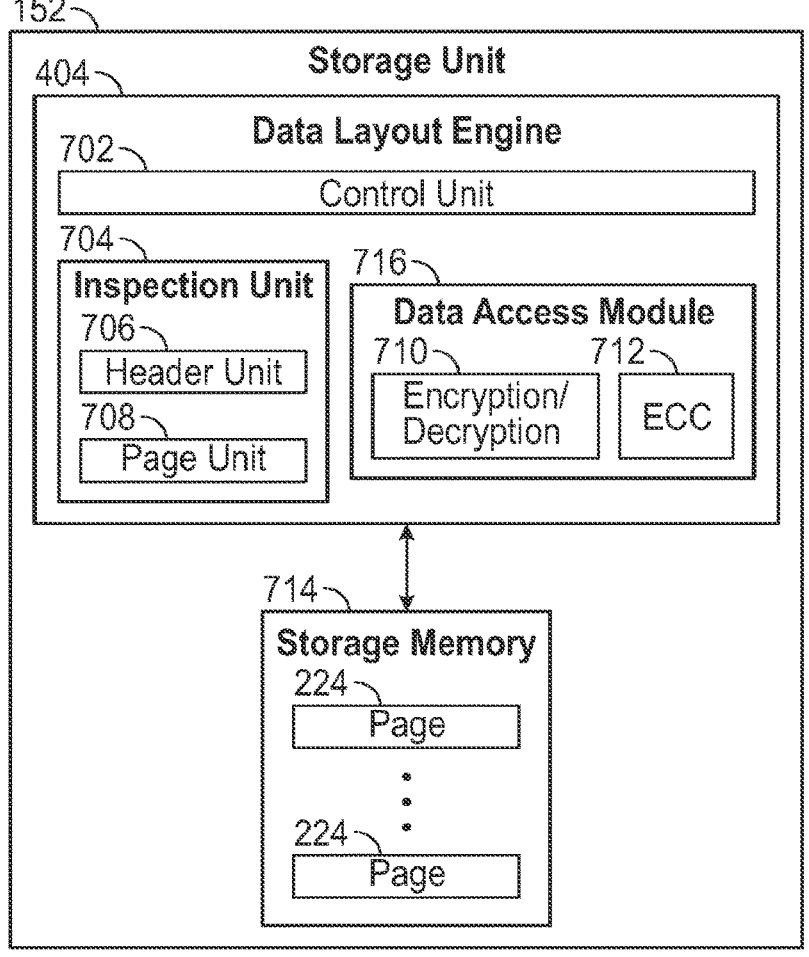
FIG. 7 is a block diagram of a storage unit with an embodiment of the data layout engine of FIG. 4, which can determine an action for the storage unit to perform based on the instruction in the metadata as shown in FIG. 6 in accordance with some embodiments.

FIG. 7 is a block diagram of a storage unit 152 with an embodiment of the data layout engine 404 of FIG. 4, which can determine an action for the storage unit 152 to perform based on the instruction 604 in the metadata 602 as shown in FIG. 6. The storage unit 152 has the data layout engine 404, and the storage memory 714 organized as pages 224. In order to access pages 224 of the storage memory 714, the data layout engine 404 is coupled to the storage memory 714, for example by a bus. In some embodiments, this bus width is greater than the width of the host interface 402 (see FIG. 4) so that a page 204 can be read efficiently into the data access module 716, without causing a bottleneck in comparison with data flow across the host interface 402. In the data layout engine 404, a control unit 702 coordinates interactions among a data access module 716, an inspection unit 704, and the storage memory 714 in some embodiments. An error correcting code unit 712 in the data access module 716 includes error correcting code logic 406 (see FIG. 4) and performs error correction on codewords 408 of a page 224 of storage memory 714, as described above with reference to FIG. 4. An encryption/decryption module 710 in the data access module 716 performs encryption (for data writes) and decryption (for data reads) to the error correcting code codewords 408, in some embodiments.

A page unit 708 in the inspection unit 704 receives an error corrected page 224 from the data access module 716, decrypted, if appropriate, by the encryption/decryption module 710. A header unit 706 in the inspection unit 704 extracts or analyzes the header 502 from the page 224. From information in the header 502, the inspection unit 704 determines the location of the metadata 602 in the page 224, and determines the location of the instruction 604 and the optional parameter 606 in the metadata 602. From this determination, the data layout engine 404 determines the instruction 604 and, where appropriate, the optional parameter 606. Based on the instruction 604, the data layout engine 404 determines an action and performs that action, as described above. The control unit 702 guides the access to the page 224 and any further page 224 directed by the instruction 604.

With reference to FIGS. 4-7, the following scenarios illustrate utilization of this hardware assisted data lookup feature. A storage node 150 encodes an instruction 604 in metadata 602 of a page 224, and passes this page 224 to a storage unit 152 to write into storage memory 714. At a later time, the storage unit 152 reads the page 224 from the storage memory 714 of the storage unit 152. The control unit 702 coordinates reading the page 224 from storage memory 714, and performing error correction using the error correcting code unit 712 of the data access module 716. If the page 224 is encrypted, the control unit 702 coordinates the encryption/decryption module 710 of the data access module 716 to decrypt the page 224. The error correcting code unit 712 or the encryption/decryption module 710 passes the page 224 to the page unit 708 of the inspection unit 704. The control unit 702 coordinates the page unit 708 to cooperate with the header unit 706 and extract information from the header 502, pointing to the metadata 602 and the instruction 604. The inspection unit 704 extracts the instruction 604 from the metadata 602 and determines whether a parameter 606 accompanies the instruction 604. In the case that there is an accompanying parameter 606, the inspection unit 704 extracts the parameter 606 from the metadata 602. Next, the control unit 702 coordinates with the inspection unit 704 to determine an action, based on the instruction 604 and, if appropriate, based also on the parameter 606. If the action is to return data from the page 224, the control unit 702 coordinates with the page unit 708 to obtain the data from the page 224, and pass the data via the host interface 402 to the storage node 150. If the action is to return data from another page, the control unit 702 coordinates with the data access module 716 to read another page 224 from the storage memory 714, perform error correction and data extraction as above from this further page 224, and pass the data via the host interface 402 to the storage node 150. If the action is to read another page and determine an action there, the control unit 702 coordinates with the data access module 716 to read that page 224, and coordinates with the inspection unit 704 to obtain the instruction 604 from that other page 224, as described above. If the action is to search in the page 224, the control unit 702 coordinates with the inspection unit 704 to obtain a search parameter 606 and search in the page 224 as loaded into the page unit 708. If the action is to search in another page 224, the control unit 702 coordinates with the data access module 716 to read that page 224, and coordinates with the inspection unit 704 to search in that page 224 as loaded into the page unit 708. Processes given in these scenarios can be nested and iterative. Further instructions 604, actions, and scenarios involving one or more pages 224 of storage memory 714 as processed by the data layout engine 404 are readily devised. It should be appreciated that FIGS. 4-7 illustrate examples of data formats for illustrative purposes and are not meant to be limiting. The embodiments may integrate multiple data formats and are not meant to be limited to the data formats illustrated as the data layout engine may be utilized to configure a logic module to handle any suitable data format.

Figure 8:
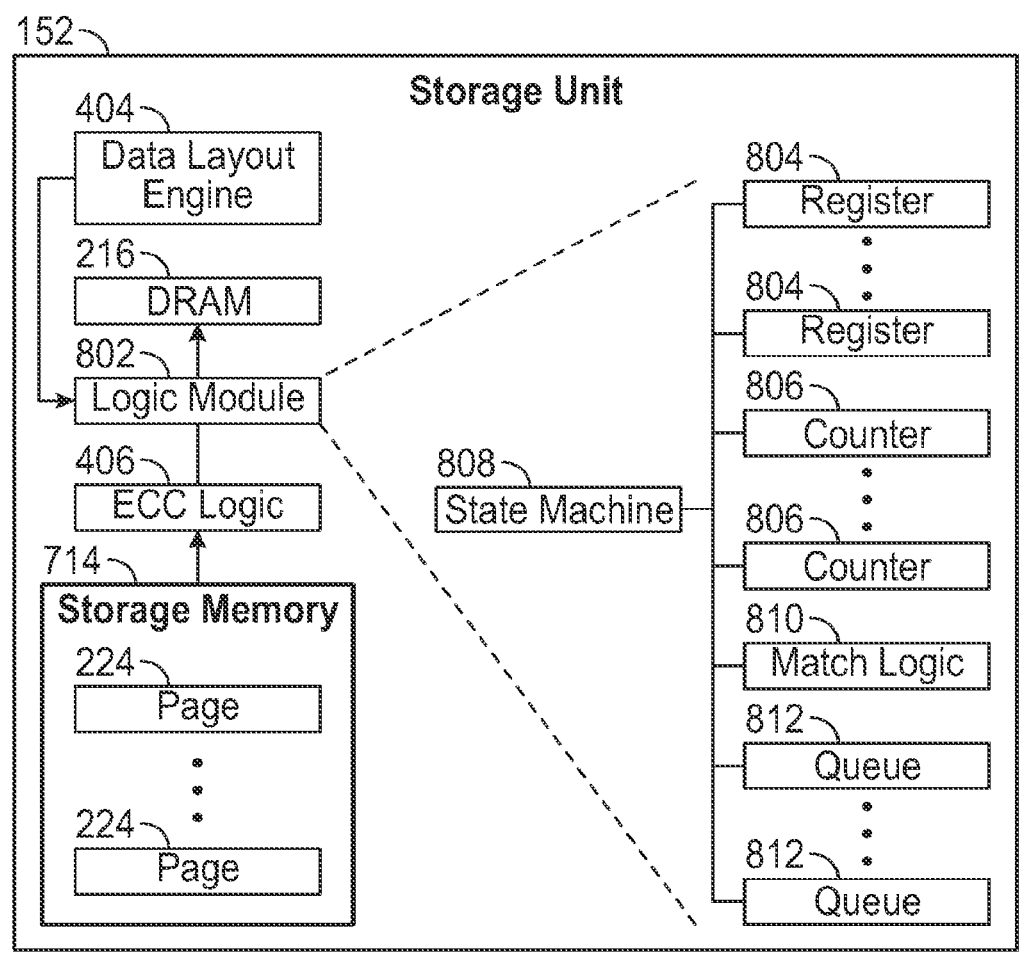
FIG. 8 is a block diagram of a storage unit with a further embodiment of the data layout engine and a logic module, which determines and performs actions based on contents of the metadata of a page as shown in FIG. 6 in accordance with some embodiments.

FIG. 8 is a block diagram of a storage unit 152 with a further embodiment of the data layout engine 404 and a logic module 802, which determines and performs actions based on contents of the metadata 602 of a page 224 as shown in FIG. 6 or other data formats. In some embodiments, the logic module 802 contains entirely logic hardware and no processor. Contents of one embodiment of the logic module 802 are shown to the right and below the logic module 802 in FIG. 8. The data layout engine 404 includes a software module executing on a processor of the storage unit 152 (e.g., the controller 212 in FIG. 3), firmware and/or hardware, in various combinations in various embodiments. The logic module 802 sits in a path between the ECC logic 406 and the DRAM 216, and monitors the data (e.g. in bytes or words) passing from storage memory 714 to DRAM 216 or other local memory acting as a buffer. Data from the storage memory 214 is error corrected, by the ECC logic 416, on the way to the DRAM 216, and may also have further formatting as described previously. Other processes of the storage unit 152 read data from the DRAM 216 or other local memory and perform further actions to prepare the data for return as metadata or user data as appropriate. As described above with reference to FIG. 6, some of the data in the storage memory 714 has parameters and/or instructions, which may be explicit or implicit, and the logic module 802 finds those parameters or instructions and determines a next action.

The data layout engine 404 is what determines what the data should be, what parameters and/or instructions are embedded in the data in the storage memory 714, and where the parameters and/or instructions are embedded (e.g., at what addresses in which pages 224 of the storage memory 714). In some embodiments, the logic module 802 can be considered a slave of the data layout engine 404, and the logic module 802 parses the data from the storage memory 714 in accordance with the format set up by the data layout engine 404. In some embodiments the data is transmitted from the storage unit in response to a request. To support this relationship, the data layout engine 404 communicates to the logic module 802 formatting information regarding expected contents of the pages 204 of the storage memory 714. In the embodiment depicted in FIG. 8, the logic module 802 includes one or more registers 804, one or more counters 806, match logic 810 and one or more state machines 808. The data layout engine 404 writes parameters to the registers 804, such as data to watch for, addresses, page numbers, etc. One of the counters 806 could be initialized to count pages 224, and/or another one of the counters 806 could be initialized to count bytes or words of a page 224, for example. The match logic 810 could use comparators, exclusive or (XOR) gates, AND or NAND gate logic, etc., to match contents of a register 804 to a byte or word flowing by from the storage memory 714 and ECC logic 406 to the DRAM 216. In some embodiments, the match logic 810 could match an address, or match a counter value. Decisions are performed by the state machine 808, which watches for data at a particular page and/or a particular address, or a match to an instruction or parameter or counter value, for example. In some embodiments, the state machine 808 performs the matching or identifying, and thus the match logic 810 is incorporated into the state machine 808. A counter 806 could determine position in a stream of bytes or whichever size data emerges from the storage memory 714 and ECC logic 406, e.g. by counting starting at the beginning of a flash page 224 or other portion of storage memory 714. A counter 806 could determine the size of a slice of data that comes in, so that the state machine 808 can direct capture of that slice of data. When the state machine 808 determines or identifies an instruction (whether explicit or implicit), the state machine 808 determines which of a number of possible actions to perform next.

For example, the instruction could be an explicit embedded instruction (like an opcode), or an implicit instruction determined from matching a parameter or matching an address of a page 224. The action could be to interpret a parameter, or to perform another read of another piece of data or another page 224. Processes could include repeating or recursive actions, e.g., one read could lead to another read which could lead to another read. In some embodiments, the hardware of the logic module 802 could alert software executing on a processor of the storage unit 152 to perform one or more actions, for example by having the state machine 808 write a parameter or value to a register 804, which is accessed by the data layout engine 404 or a processor of the storage unit 152. In some embodiments, one or more of the registers 804 is in the form of a queue. In other embodiments logic module 802 includes queues 812. When the state machine 808 determines that another read is needed, the hardware of the logic module 802 could perform the read itself, or this information may be tagged and could be placed into a queue and software could do the next read. Hardware of the logic module 802 could alert software that the software needs to perform another action, such as bookkeeping. Actions for the state machine 808 to perform could include searching for a next parameter, or alerting software to look for a next parameter in some embodiments. It should be appreciated that the action to perform may be configurable in some embodiments.

The state machine 808 has sufficient capability to analyze and identify an action from the data flow and perform that action without software being involved in that loop, and to directly perform the next action and/or direct the software to perform the next action, in various embodiments. With registers 804 that have content set up by the data layout engine 404, and content in storage memory 714 as set up by the data layout engine 404, the state machine 808 is able to monitor for implicit or explicit instructions that match contents of the registers 804 and/or the counters 806. If there is a match identified, the state machine 802 performs one or more actions, which could include reading additional data from the storage memory 714, writing to one or more registers 804, searching for additional parameters or matches, or notifying the data layout engine 404 or a processor of the storage unit 152 (e.g., by writing to a register 804 or a queue) to perform one or more actions. By having a logic module 802 that is able to monitor and parse data flowing through from the storage memory 714, the storage unit 152 has more efficient functionality than if a processor had to perform a read, parsing, and issuing of next read instruction etc., with attendant roundtrips of data and multiple instruction fetches and execution cycles. The logic module 802 thus improves computational efficiency of the storage unit 152 and storage systems using one or more storage units 152 and improves data throughput rates of storage systems, as a technological advance.

Figure 9:
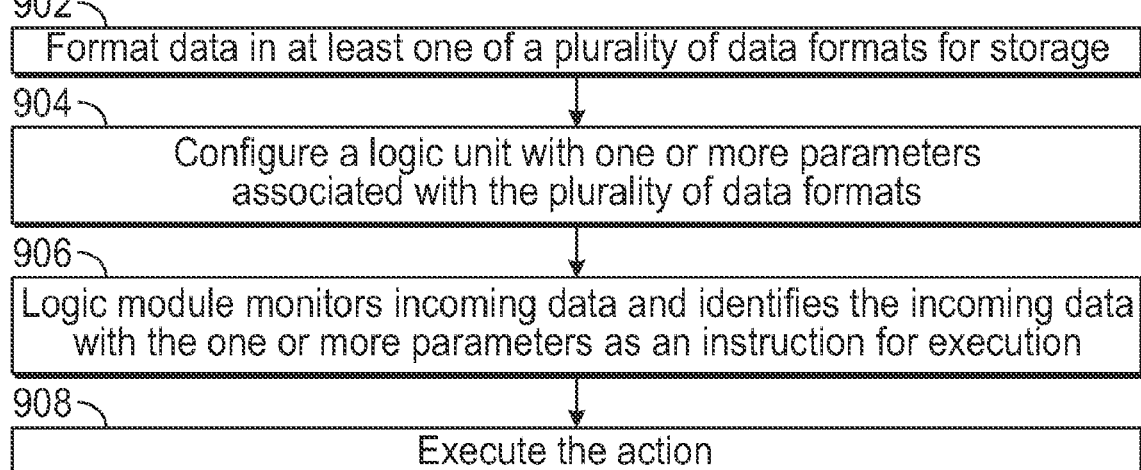
FIG. 9 is a flow diagram of a method for hardware assisted data lookup in a storage unit, which can be performed by a storage unit or more specifically by a data layout engine and a logic module in a storage unit in accordance with some embodiments.

FIG. 9 is a flow diagram of a method for hardware assisted data lookup in a storage unit, which can be performed by a storage unit or more specifically by a data layout engine and a logic module in a storage unit. In various embodiments, this method could be performed by hardware logic, and/or a processor, in a storage unit. In an action 902, data is formatted in at least one of a plurality of data formats for storage in the storage unit. As noted above, the embodiments may handle multiple data formats and are not limited to a particular data format. In an action 904, the data layout engine communicates one or more parameters associated with the plurality of data formats to configure a logic unit or module. For example, the data layout engine could write a parameter to a register or counter in the logic module as described above. In an action 906, the logic module monitors incoming data from the storage memory to a buffer memory in the storage unit. The logic module identifies an explicit or implicit instruction for execution in the incoming data flow, based on the parameter(s) provided by the data layout engine. The logic module determines an action based on the instruction, in an action 906. In an action 908, the logic module executes the action. For example, the logic module could read a page from storage memory, write to a register of the logic module, write to a queue of the logic module, search in the storage memory, notify a processor of a storage unit to perform a further action, or perform further actions.

Figure 10:
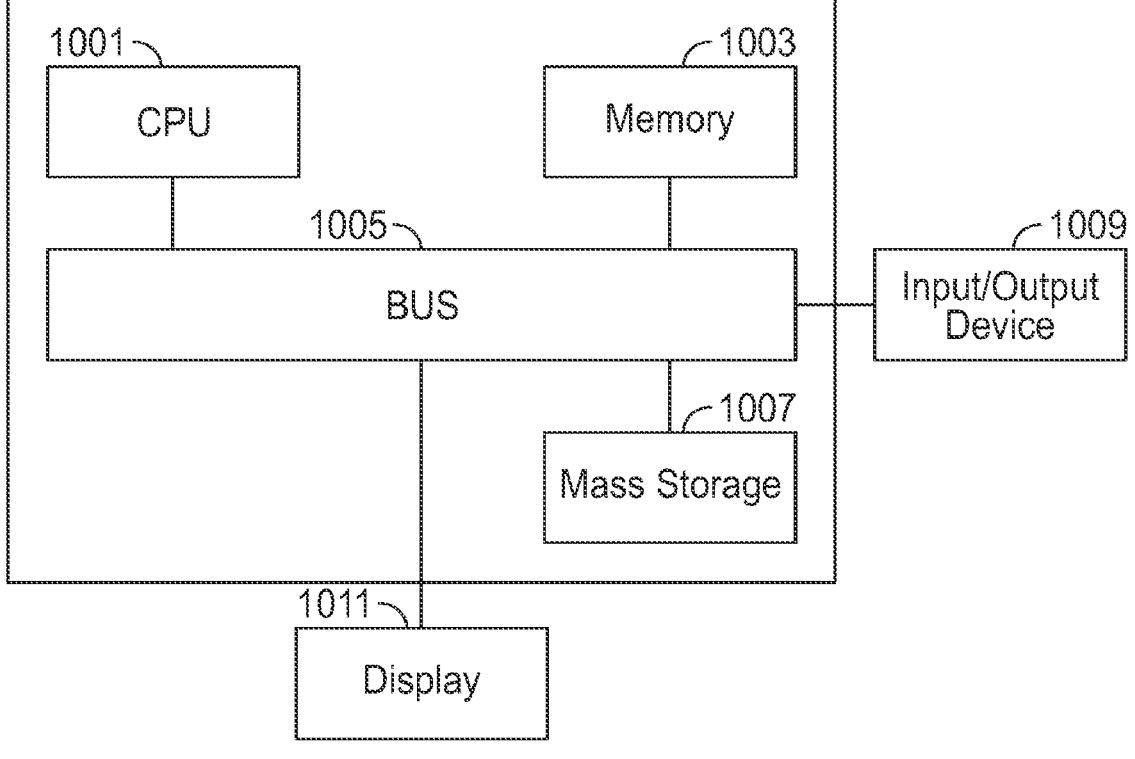
FIG. 10 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 10 is an illustration showing an exemplary computing device which may implement the embodiments described herein. The computing device of FIG. 10 may be used to perform embodiments of the functionality for the data lookups, parameter passing and data handling in accordance with some embodiments. The computing device includes a central processing unit (CPU) 1001, which is coupled through a bus 1005 to a memory 1003, and mass storage device 1007. Mass storage device 1007 represents a persistent data storage device such as a floppy disc drive or a fixed disc drive, which may be local or remote in some embodiments. Memory 1003 may include read only memory, random access memory, etc. Applications resident on the computing device may be stored on or accessed via a computer readable medium such as memory 1003 or mass storage device 1007 in some embodiments. Applications may also be in the form of modulated electronic signals modulated accessed via a network modem or other network interface of the computing device. It should be appreciated that CPU 1001 may be embodied in a general-purpose processor, a special purpose processor, or a specially programmed logic device in some embodiments.

Display 1011 is in communication with CPU 1001, memory 1003, and mass storage device 1007, through bus 1005. Display 1011 is configured to display any visualization tools or reports associated with the system described herein. Input/output device 1009 is coupled to bus 1005 in order to communicate information in command selections to CPU 1001. It should be appreciated that data to and from external devices may be communicated through the input/output device 1009. CPU 1001 can be defined to execute the functionality described herein to enable the functionality described with reference to FIGS. 1-9. The code embodying this functionality may be stored within memory 1003 or mass storage device 1007 for execution by a processor such as CPU 1001 in some embodiments. The operating system on the computing device may be MS DOS™, MS-WINDOWS™, OS/2™, UNIX™, LINUX™, or other known operating systems. It should be appreciated that the embodiments described herein may also be integrated with a virtualized computing system implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A storage system comprising:

a plurality of storage devices; and a processor, operatively coupled to the plurality of storage devices, configured to:

encode an instruction in metadata to be stored at a page of storage memory, the instruction comprising a command to perform an action on another page of the storage memory; and provide the page to a storage device of the plurality of storage devices for writing into the storage memory of the storage device, wherein the storage device is to perform the action upon reading the page comprising the instruction from the storage memory.

2. The storage system of claim 1, wherein the processor is further configured to:

encode one or more parameters associated with a plurality of data formats in the metadata, the one or more parameters to be used to configure a logic unit of the storage device.

3. The storage system of claim 1, wherein the instruction contains information on a next action to be performed.

4. The storage system of claim 1, wherein the instruction encodes information indicating where the another page is located.

5. The storage system of claim 1, wherein the processor is further configured to:

parse data from the storage device, wherein the data is parsed as the data flows through the storage device.

6. The storage system of claim 1, wherein the plurality of storage devices comprise solid-state storage memory having erase blocks that are directly mapped.

7. The storage system of claim 1, wherein a logic unit of the storage device executes the instruction.

8. A method comprising:

encoding, by a processor operatively coupled to a plurality of storage devices, an instruction in metadata to be stored at a page of storage memory, the instruction comprising a command to perform an action on another page of the storage memory; and providing the page to a storage device of the plurality of storage devices for writing into the storage memory of the storage device, wherein the storage device is to perform the action upon reading the page comprising the instruction from the storage memory.

9. The method of claim 8, further comprising:

encoding one or more parameters associated with a plurality of data formats in the metadata, the one or more parameters to be used to configure a logic unit of the storage device.

10. The method of claim 8, wherein the instruction contains information on a next action to be performed.

11. The method of claim 8, wherein the instruction encodes information indicating where the another page is located.

12. The method of claim 8, further comprising:

parsing data from the storage device, wherein the data is parsed as the data flows through the storage device.

13. The method of claim 8, wherein the plurality of storage devices comprise solid state storage memory having erase blocks that are directly mapped.

14. The method of claim 8, wherein a logic unit of the storage device unit executes the instruction.

15. A non-transitory computer-readable storage medium storing instructions which, when executed, cause a processor to:

encode an instruction in metadata to be stored at a page of storage memory, the instruction comprising a command to perform an action on another page of the storage memory; and provide the page to a storage device of a plurality of storage devices for writing into the storage memory of the storage device, wherein the storage device is to perform the action upon reading the page comprising the instruction from the storage memory.

16. The non-transitory computer-readable storage medium of claim 15, wherein the processor is further to:

encode one or more parameters associated with a plurality of data formats in the metadata, the one or more parameters to be used to configure a logic unit of the storage device.

17. The non-transitory computer-readable storage medium of claim 15, wherein the instruction contains information on a next action to be performed.

18. The non-transitory computer-readable storage medium of claim 15, wherein the instruction encodes information indicating where the another page is located.

19. The non-transitory computer-readable storage medium of claim 15, wherein the processor is further to:

parse data from the storage device, wherein the data is parsed as the data flows through the storage device.

20. The non-transitory computer-readable storage medium of claim 15, wherein the plurality of storage devices comprise solid-state storage memory having erase blocks that are directly mapped.

* * * * *